(12) United States Patent
Song et al.

(10) Patent No.: US 11,737,266 B2
(45) Date of Patent: Aug. 22, 2023

(54) METHOD OF FORMING A SEMICONDUCTOR DEVICE WITH MEMORY CELLS, HIGH VOLTAGE DEVICES AND LOGIC DEVICES ON A SUBSTRATE

(71) Applicant: Silicon Storage Technology, Inc., San Jose, CA (US)

(72) Inventors: Guo Xiang Song, Shanghai (CN); Chunming Wang, Shanghai (CN); Leo Xing, Shanghai (CN); Xian Liu, Sunnyvale, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 257 days.

(21) Appl. No.: 17/339,880

(22) Filed: Jun. 4, 2021

(65) Prior Publication Data
US 2022/0278119 A1 Sep. 1, 2022

(30) Foreign Application Priority Data
Mar. 1, 2021 (CN) .......................... 202110226090.6

(51) Int. Cl.
*H01L 27/088* (2006.01)
*H10B 41/41* (2023.01)

(52) U.S. Cl.
CPC .................................. *H10B 41/41* (2023.02)

(58) Field of Classification Search
CPC ....... H01L 27/11529; H01L 21/823456; H01L 27/088; H01L 21/823462; H01L 27/11546;
(Continued)

(56) References Cited

U.S. PATENT DOCUMENTS

| 6,747,310 B2 | 6/2004 | Fan et al. |
| 7,868,375 B2 | 1/2011 | Liu et al. |

(Continued)

FOREIGN PATENT DOCUMENTS

| TW | I 654744 | 3/2019 |
| WO | 2017 014866 | 1/2017 |

OTHER PUBLICATIONS

Taiwanese Office Action dated Oct. 14, 2022 corresponding to the counterpart Taiwanese Patent Application No. 111102858.
(Continued)

*Primary Examiner* — Selim U Ahmed
(74) *Attorney, Agent, or Firm* — DLA Piper LLP (US)

(57) ABSTRACT

A method of forming a semiconductor device by recessing the upper surface of a semiconductor substrate in first and second areas but not a third area, forming a first conductive layer in the three areas, forming a second conductive layer in all three areas, removing the first and second conductive layers from the second area and portions thereof from the first area resulting in pairs of stack structures each with a control gate over a floating gate, forming a third conductive layer in all three areas, forming a protective layer in the first and second areas and then removing the third conductive layer from the third area, then forming blocks of dummy conductive material in the third area, then etching in the first and second areas to form select and HV gates, and then replacing the blocks of dummy conductive material with blocks of metal material.

16 Claims, 25 Drawing Sheets

MC Area 2

(58) Field of Classification Search
CPC ......... H01L 29/42328; H01L 27/11524; H01L 27/11531; H01L 29/66825; H01L 29/42324; H01L 27/11582; H01L 27/105; H10B 41/30; H10B 43/10; H10B 41/27
See application file for complete search history.

(56) References Cited

U.S. PATENT DOCUMENTS

| | | |
|---|---|---|
| 7,927,994 B1 | 4/2011 | Liu et al. |
| 9,276,005 B1 | 3/2016 | Zhou et al. |
| 2019/0172942 A1* | 6/2019 | Yang ...................... H10B 41/49 |
| 2021/0013220 A1* | 1/2021 | Lin ................... H01L 29/66545 |

OTHER PUBLICATIONS

PCT Search Report dated Nov. 24, 2021 for the corresponding PCT Patent Application No. US2021 036311.

\* cited by examiner

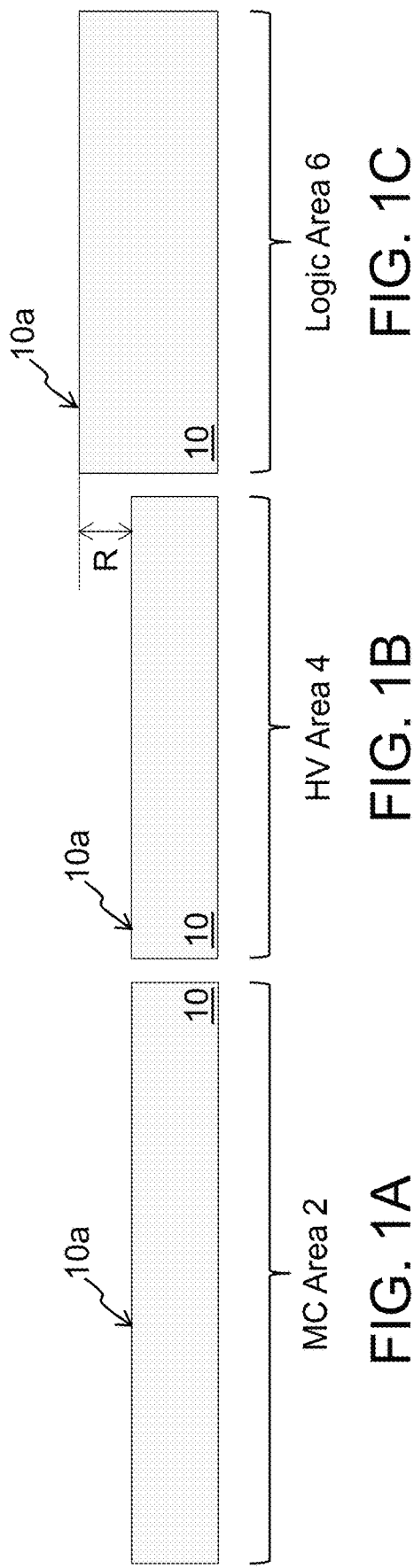

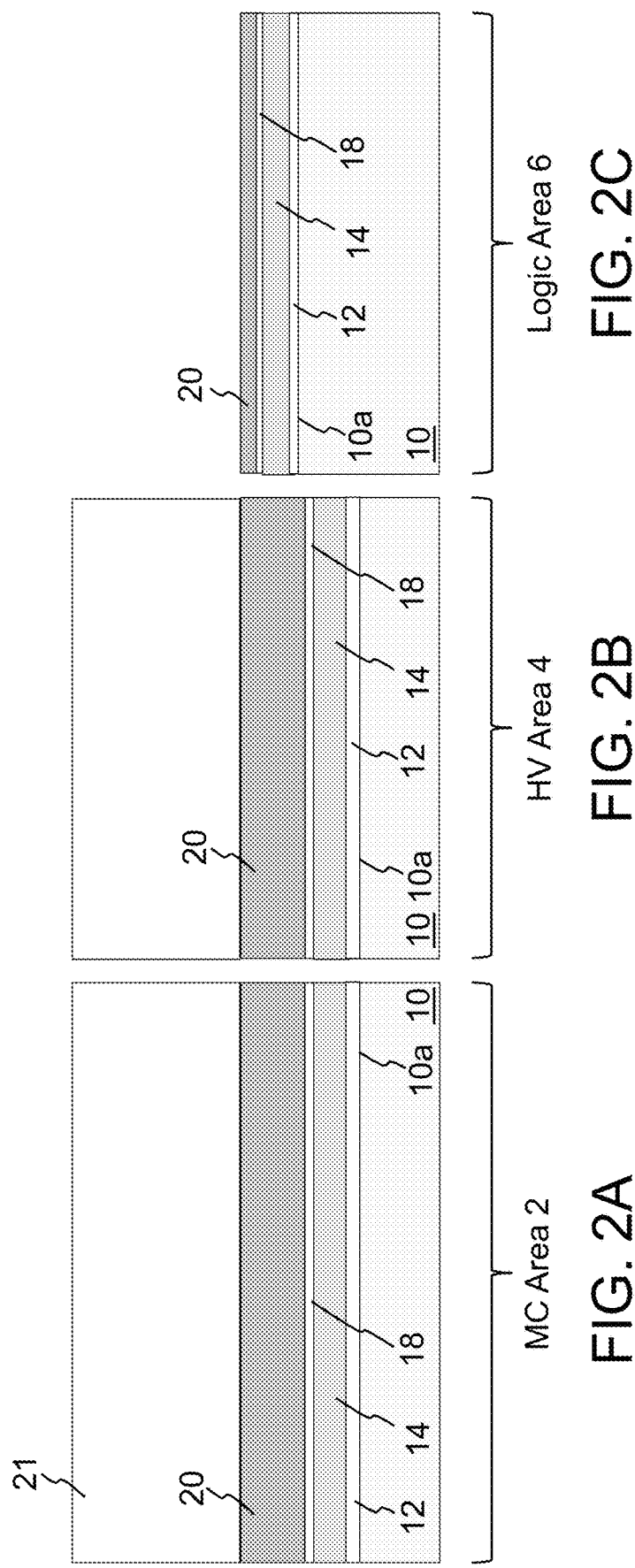

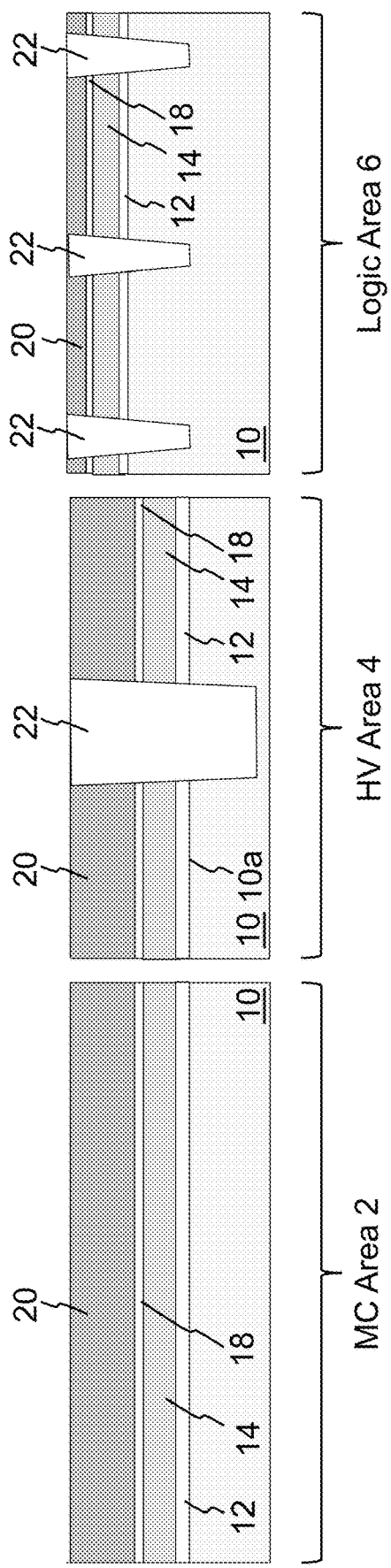

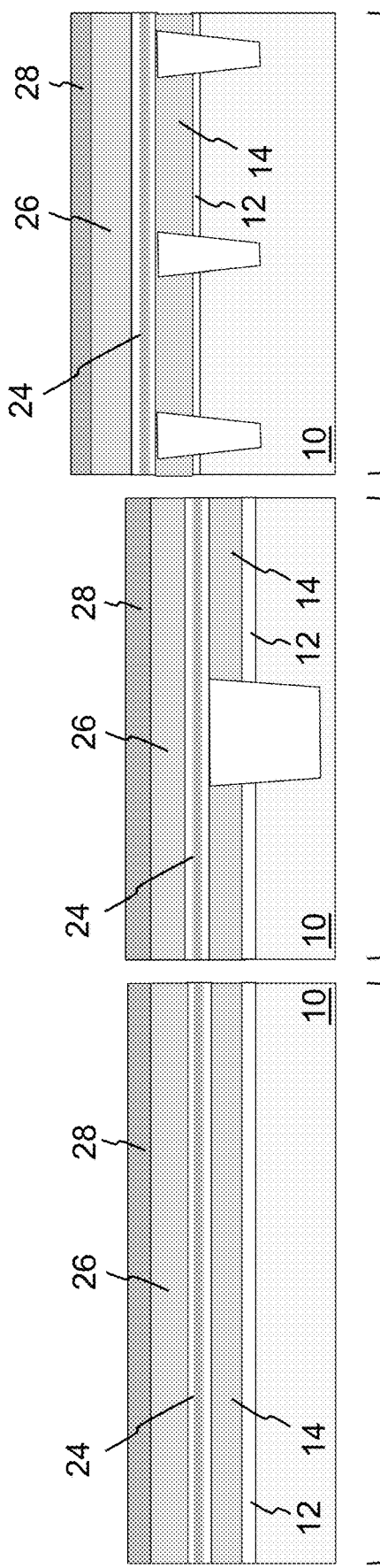

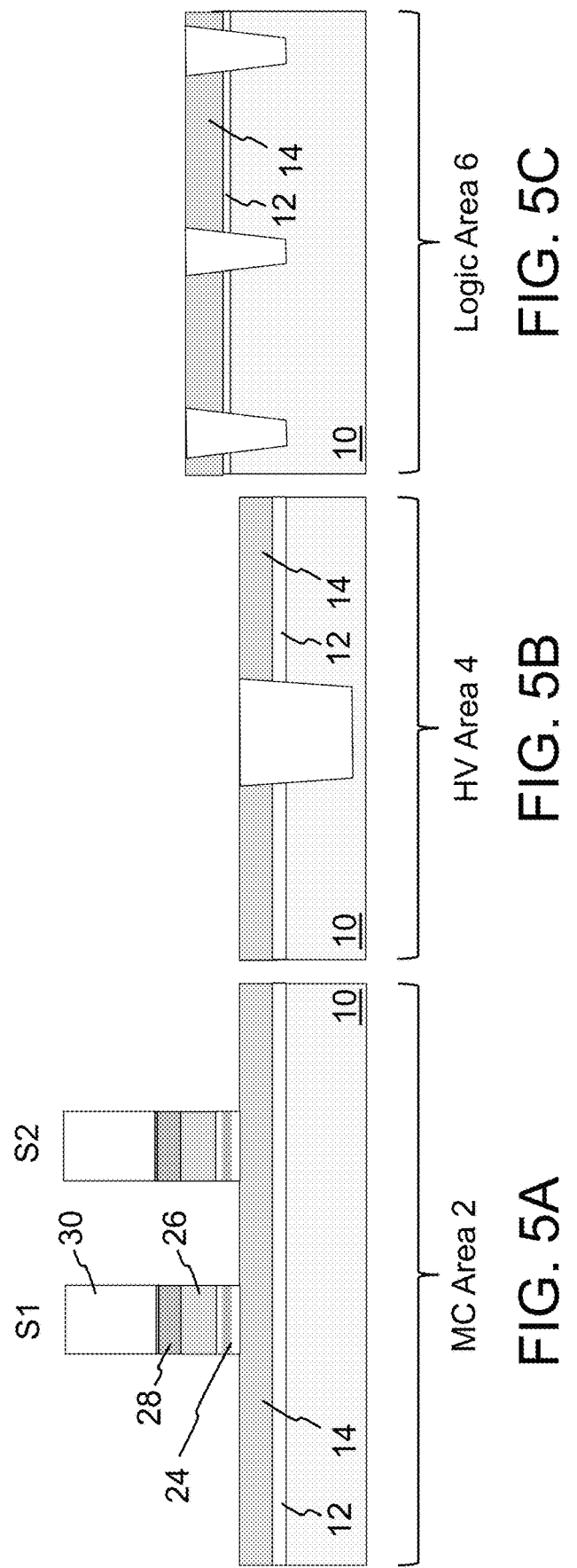

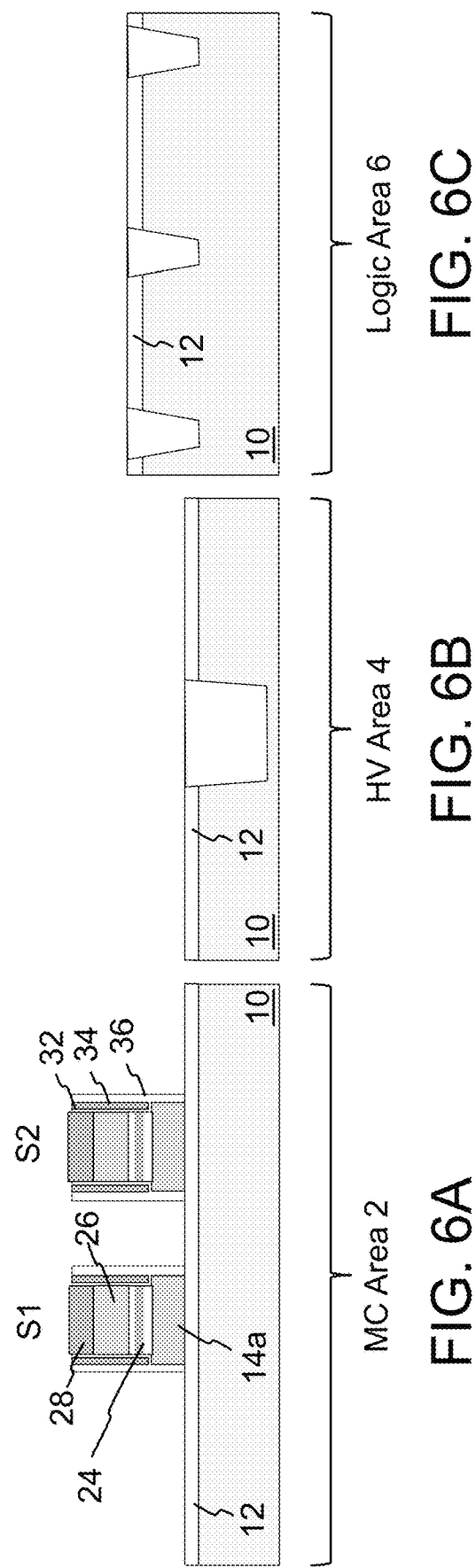

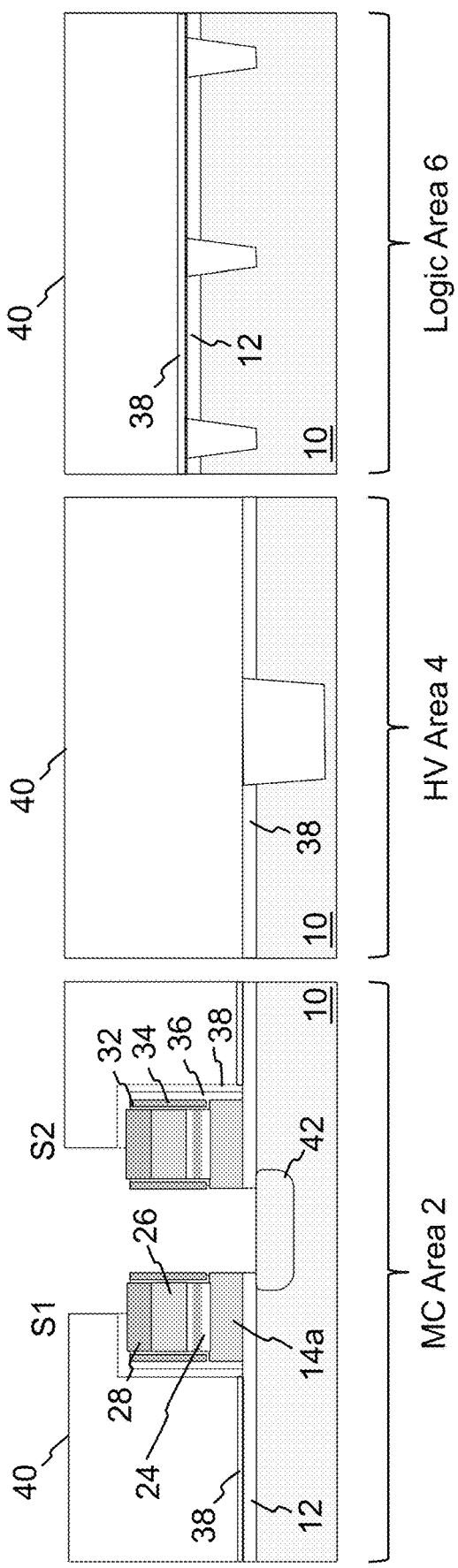

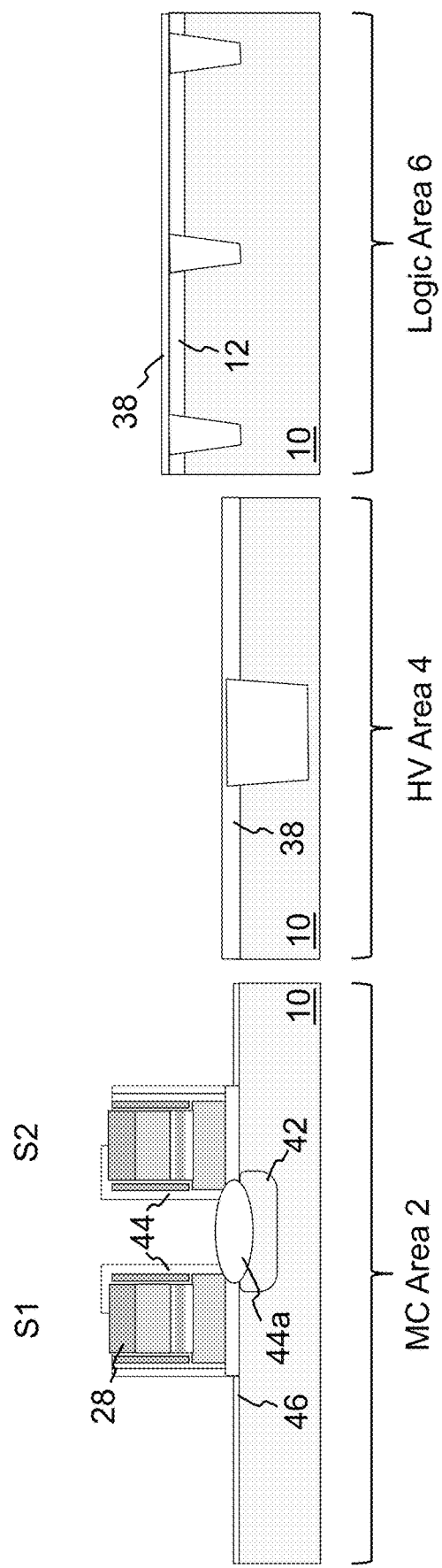

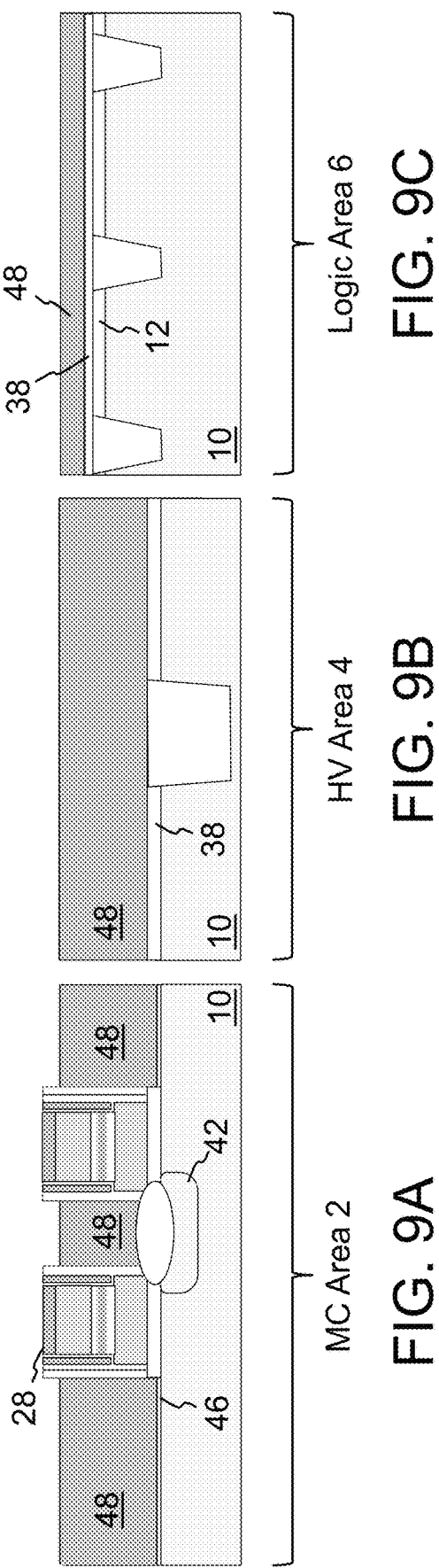

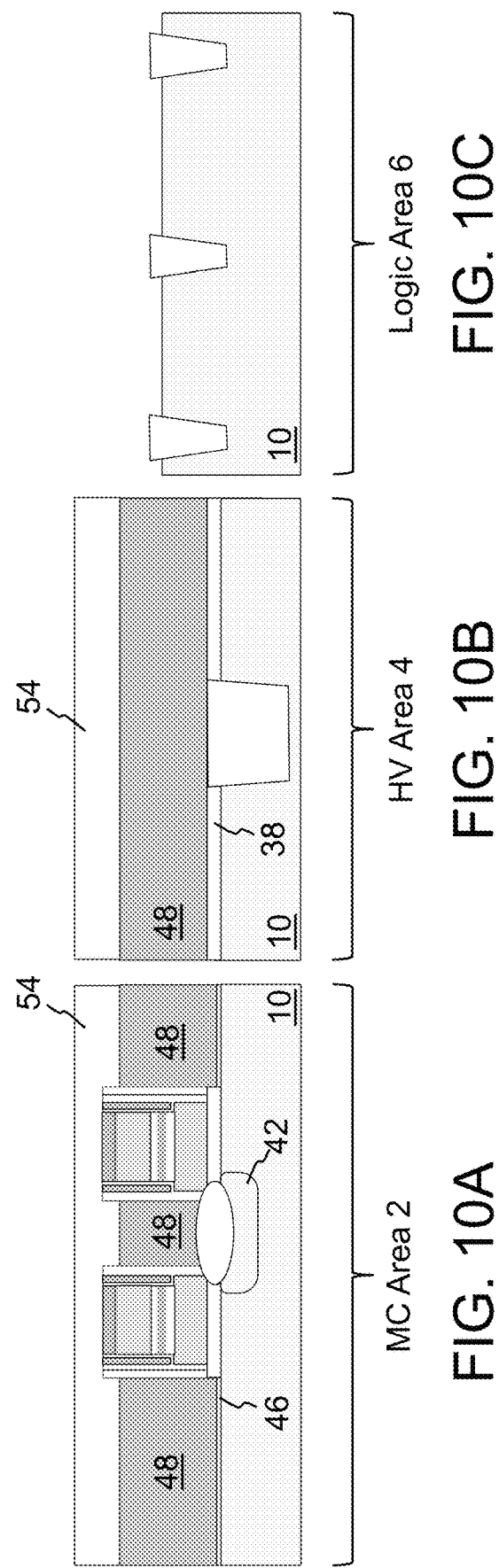

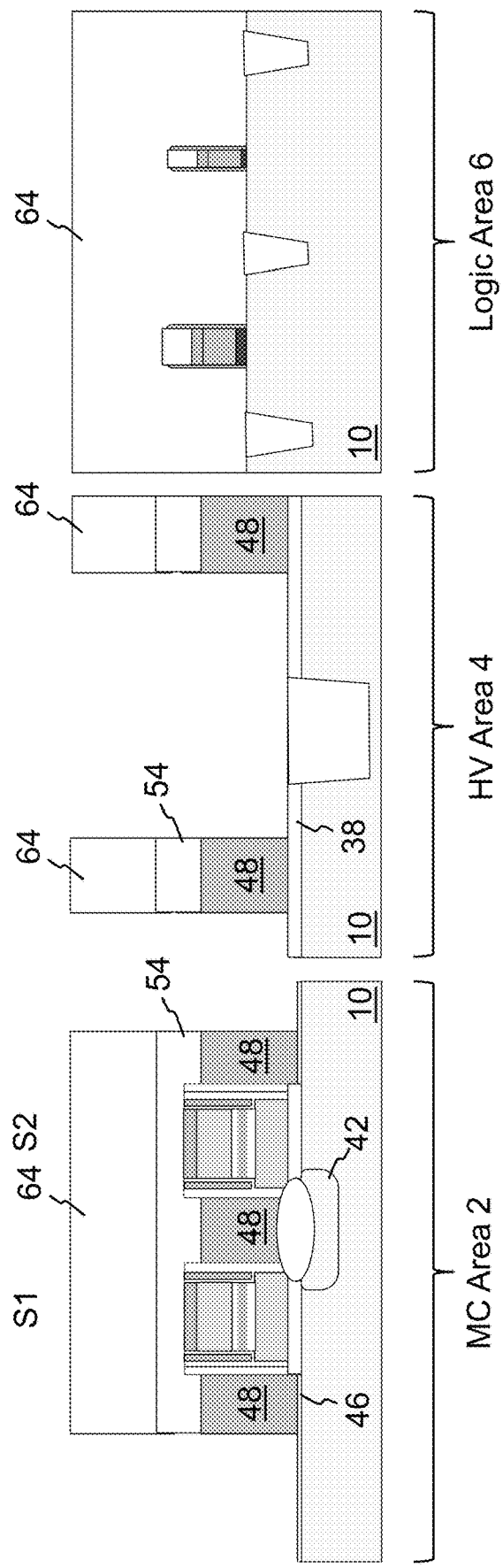

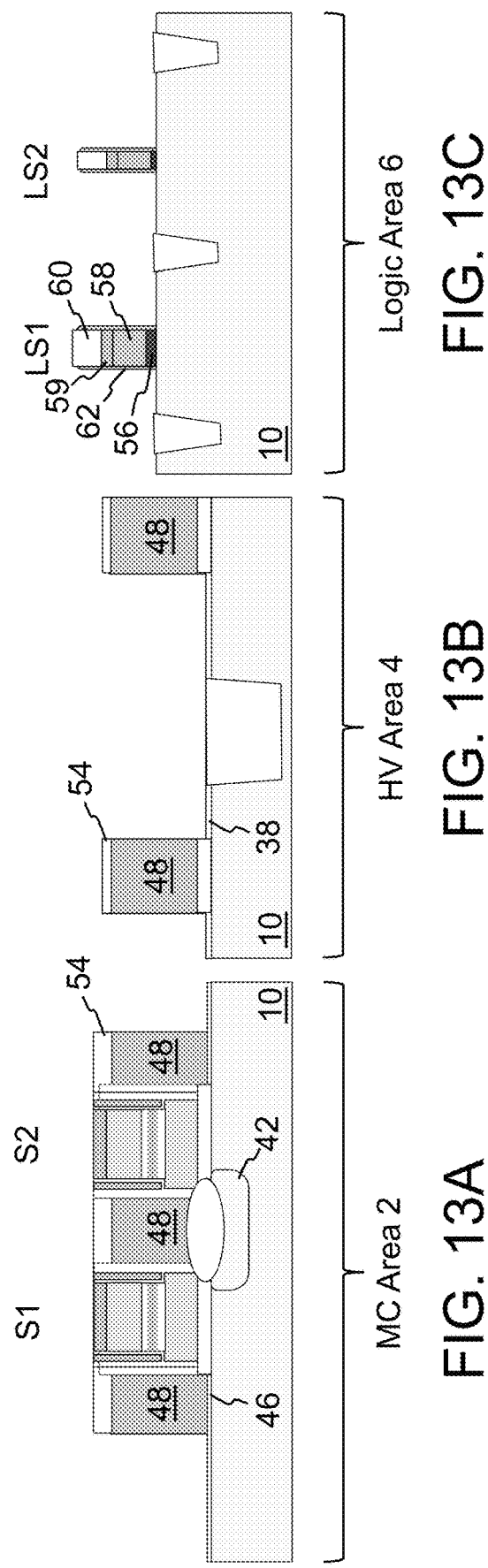

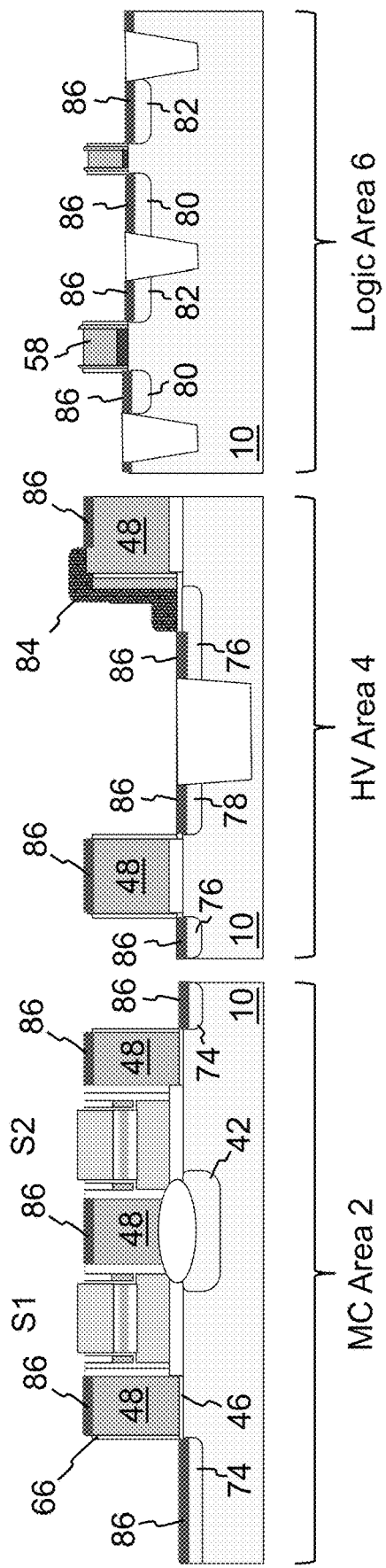

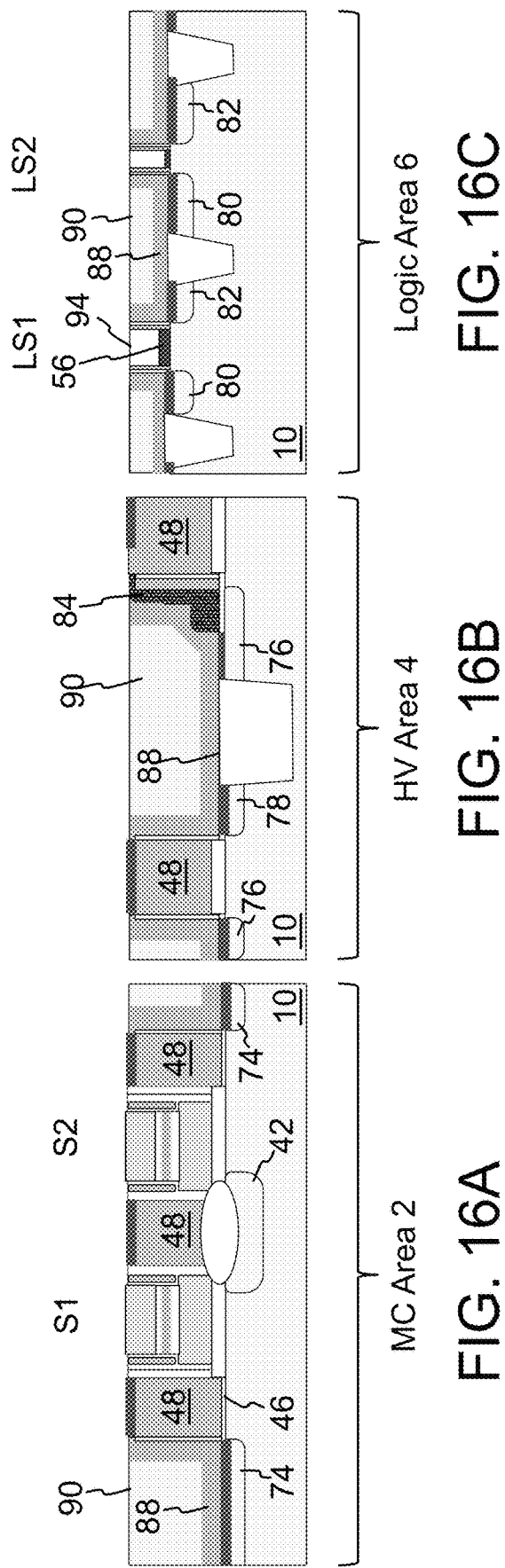

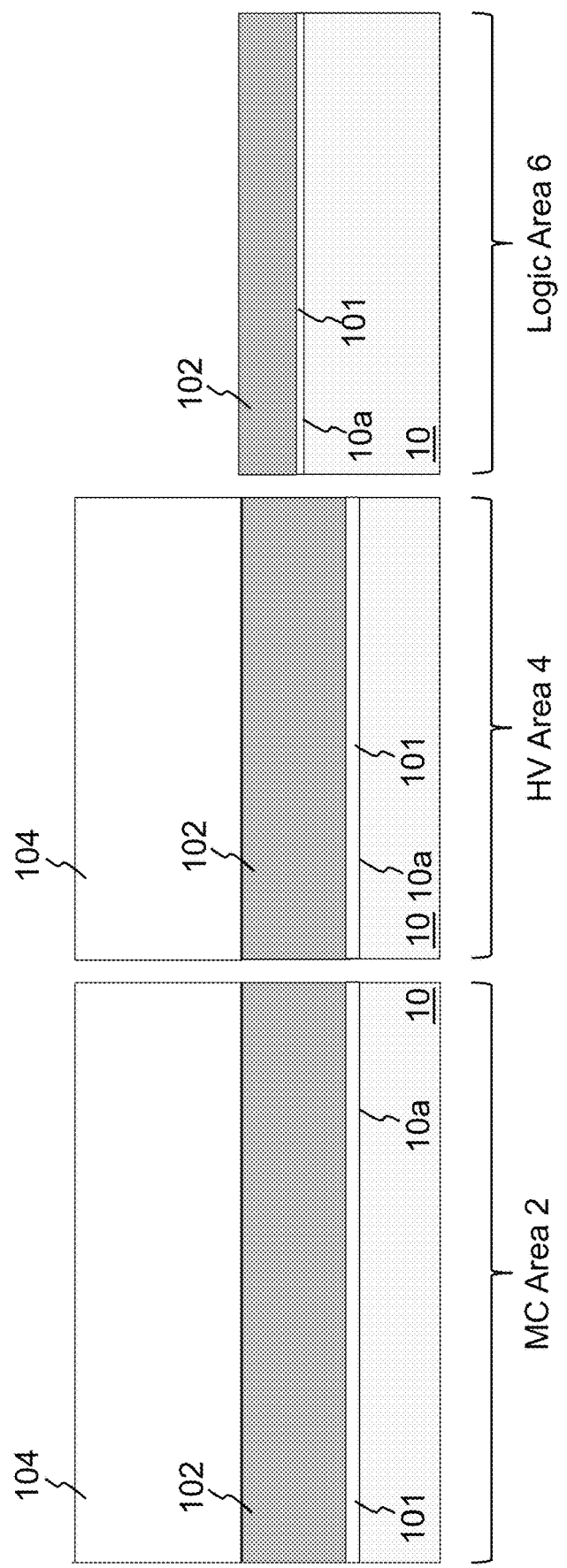

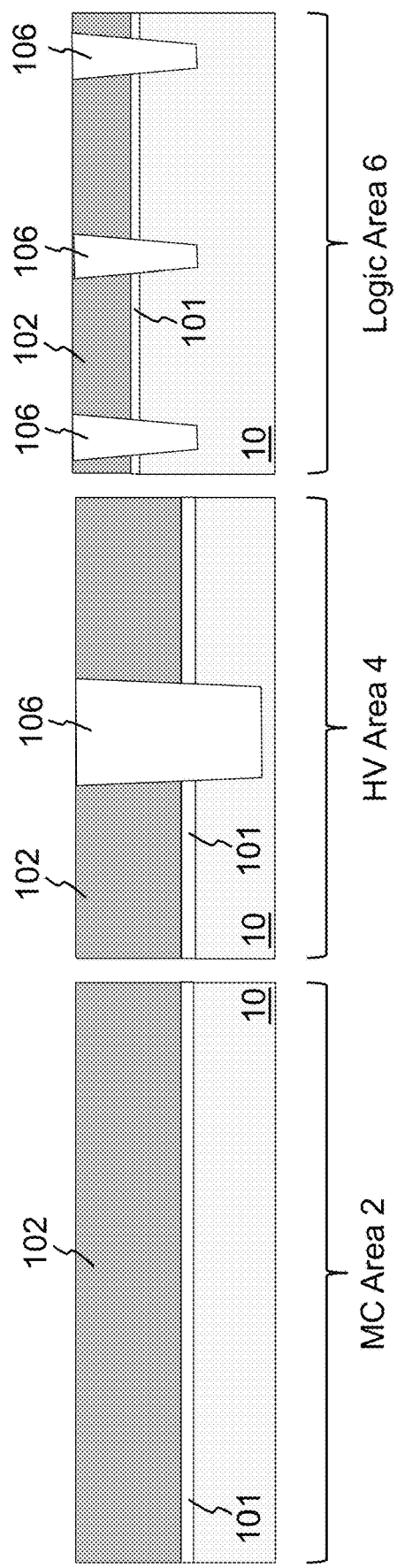

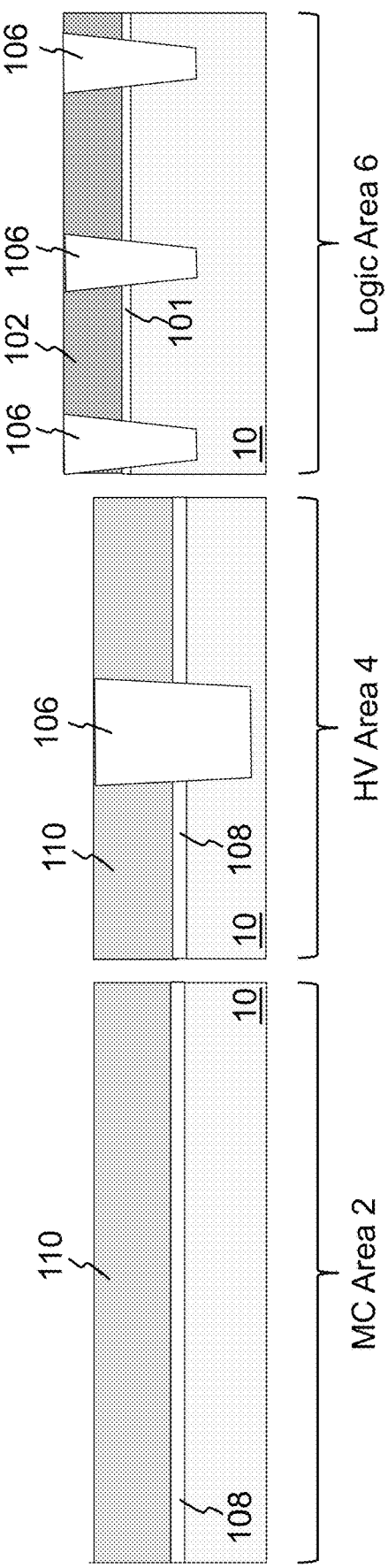

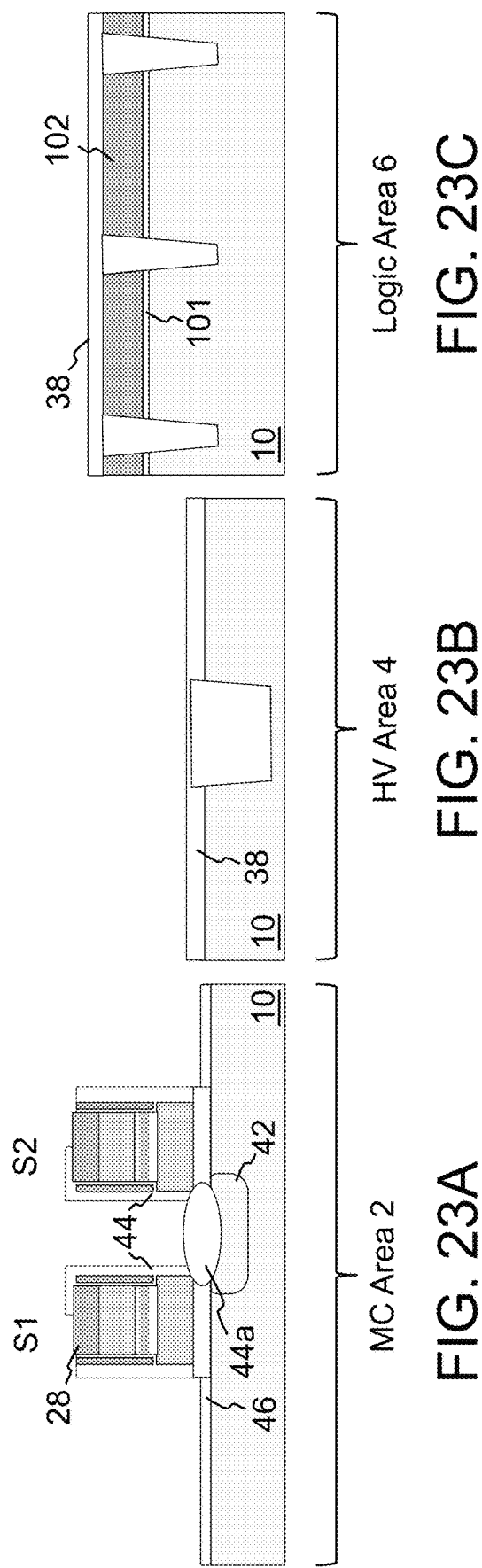

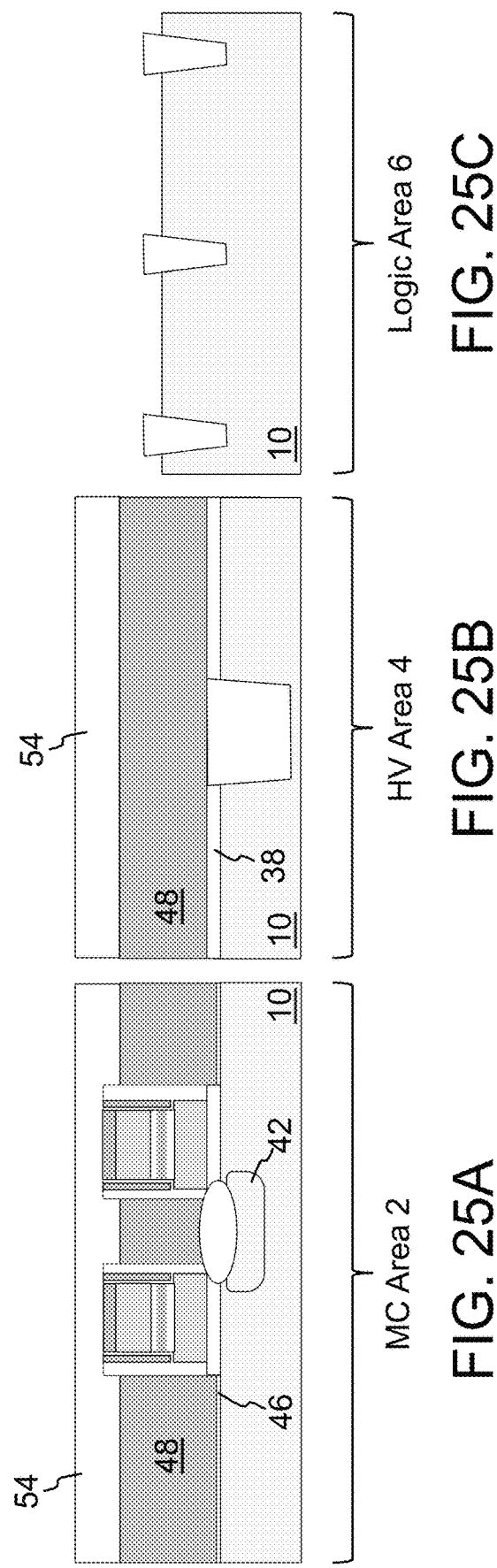

METHOD OF FORMING A SEMICONDUCTOR DEVICE WITH MEMORY CELLS, HIGH VOLTAGE DEVICES AND LOGIC DEVICES ON A SUBSTRATE

PRIORITY CLAIM

This application claims priority to Chinese Patent Application No. 202110226090.6, filed on Mar. 1, 2021, and titled "Method Of Forming A Semiconductor Device With Memory Cells, High Voltage Devices And Logic Devices On A Substrate."

FIELD OF THE INVENTION

The present invention relates to semiconductor devices with embedded non-volatile memory cells.

BACKGROUND OF THE INVENTION

Non-volatile memory semiconductor devices formed on silicon semiconductor substrates are well known. For example, U.S. Pat. Nos. 6,747,310, 7,868,375 and 7,927,994 disclose memory cells with four gates (floating gate, control gate, select gate and erase gate) formed on a semiconductor substrate, which are incorporated herein by reference for all purposes. Source and drain regions are formed as diffusion implant regions into the substrate, defining a channel region therebetween in the substrate. The floating gate is disposed over and controls the conductivity of a first portion of the channel region, the select gate is disposed over and controls the conductivity of a second portion of the channel region, the control gate is disposed over the floating gate, and the erase gate is disposed over the source region and laterally adjacent to the floating gate.

It is also known to form low and high voltage logic devices on the same substrate as the non-volatile memory cells. See for example U.S. Pat. No. 9,276,005, which is incorporated herein by reference for all purposes. New gate materials such as high K dielectric and metal gates are also used to increase performance. However, processing steps in forming the memory cells can adversely affect the concurrently fabricated logic devices, and vice versa.

There is a need for an improved method of making a device that includes memory cells, low voltage logic devices and high voltage devices on the same substrate.

BRIEF SUMMARY OF THE INVENTION

The aforementioned problems and needs are addressed by a method of forming a semiconductor device, which includes:
providing a substrate of semiconductor material that includes a first area, a second area and a third area;
recessing an upper surface of the substrate in the first area and an upper surface of the substrate in the second area relative to an upper surface of the substrate in the third area;
forming a first conductive layer disposed over and insulated from the upper surfaces in the first and second and third areas;
forming an insulation layer on the first conductive layer in the first and second and third areas;
thinning the insulation layer in the third area without thinning the insulation layer in the first and second areas;
forming trenches through the insulation layer and the first conductive layer, and into the substrate, in the first, second and third areas;
filling the trenches with insulation material;
after the filling of the trenches, removing the insulation layer from the first, second and third areas;
forming a second conductive layer disposed over and insulated from the first conductive layer in the first and second and third areas;
performing one or more etches to selectively remove portions of the first and second conductive layers in the first area, to entirely remove the first and second conductive layers from the second and third areas, wherein the one or more etches result in pairs of stack structures in the first area with each of the stack structures including a control gate of the second conductive layer disposed over and insulated from a floating gate of the first conductive layer;
forming first source regions in the substrate each disposed between one of the pairs of stack structures;
forming a third conductive layer disposed over and insulated from the upper surfaces of the substrate in the first and second and third areas;
forming a protective insulation layer over the third conductive layer in the first and second areas;
after the forming of the protective insulation layer, removing the third conductive layer from the third area;
after the removing of the third conductive layer from the third area, forming blocks of dummy conductive material disposed over and insulated from the upper surface in the third area;
after the forming of the blocks of dummy conductive material in the third area, etching portions of the protective insulation layer and portions of the third conductive layer in the first and second areas to form a plurality of select gates of the third conductive layer each disposed adjacent to one of the stack structures and to form a plurality of HV gates of the third conductive layer each disposed over and insulated from the upper surface of the substrate in the second area;
forming first drain regions in the substrate each adjacent to one of the select gates;
forming second source regions in the substrate each adjacent one of the HV gates;
forming second drain regions in the substrate each adjacent one of the ITV gates;
forming third source regions in the substrate each adjacent one of the blocks of dummy conductive material;
forming third drain regions in the substrate each adjacent one of the blocks of dummy conductive material; and
replacing each of the blocks of dummy conductive material with a block of metal material.

A method of forming a semiconductor device can include:
providing a substrate of semiconductor material that includes a first area, a second area and a third area;
recessing an upper surface of the substrate in the first area and an upper surface of the substrate in the second area relative to an upper surface of the substrate in the third area;
forming an insulation layer over the substrate;
thinning the insulation layer in the third area without thinning the insulation layer in the first and second areas;
forming trenches through the insulation layer and into the substrate, in the first, second and third areas;
filling the trenches with insulation material;
after the filling of the trenches, removing the insulation layer from the first and second areas;
forming a first conductive layer disposed over and insulated from the upper surfaces in the first and second;

forming a second conductive layer disposed over and insulated from the first conductive layer in the first and second areas;

performing one or more etches to selectively remove portions of the first and second conductive layers in the first area, and to entirely remove the first and second conductive layers from the second area, wherein the one or more etches result in pairs of stack structures in the first area with each of the stack structures including a control gate of the second conductive layer disposed over and insulated from a floating gate of the first conductive layer;

forming first source regions in the substrate each disposed between one of the pairs of stack structures;

forming a third conductive layer disposed over and insulated from the upper surfaces of the substrate in the first and second areas;

forming a protective insulation layer over the third conductive layer in the first and second areas;

after the forming of the protective insulation layer, removing the protective insulation layer from the third area;

after the removing of the protective insulation layer from the third area, forming blocks of dummy conductive material disposed over and insulated from the upper surface in the third area;

after the forming of the blocks of dummy conductive material in the third area, etching portions of the protective insulation layer and portions of the third conductive layer in the first and second areas to form a plurality of select gates of the third conductive layer each disposed adjacent to one of the stack structures and to form a plurality of HV gates of the third conductive layer each disposed over and insulated from the upper surface in the second area;

forming first drain regions in the substrate each adjacent to one of the select gates;

forming second source regions in the substrate each adjacent one of the HV gates;

forming second drain regions in the substrate each adjacent one of the HV gates;

forming third source regions in the substrate each adjacent one of the blocks of dummy conductive material;

forming third drain regions in the substrate each adjacent one of the blocks of dummy conductive material; and replacing each of the blocks of dummy conductive material with a block of metal material.

Other objects and features of the present invention will become apparent by a review of the specification, claims and appended figures.

BRIEF DESCRIPTION OF THE DRAWINGS

FIGS. 1A-16A are cross sectional views of the memory cell area showing the steps in forming the memory cells.

FIGS. 1B-16B are cross sectional views of the HV area showing the steps in forming the HV devices.

FIGS. 1C-16C are cross sectional views of the logic area showing the steps in forming the logic devices.

FIGS. 20A-25A are cross sectional views of the memory cell area showing the steps in forming the memory cells in an alternate embodiment.

FIGS. 20B-25B are cross sectional views of the HV area showing the steps in forming the HV devices in an alternate embodiment.

FIGS. 20C-25C are cross sectional views of the logic area showing the steps in forming the logic devices in an alternate embodiment.

DETAILED DESCRIPTION OF THE INVENTION

Figures 11A, 11B, 11C:
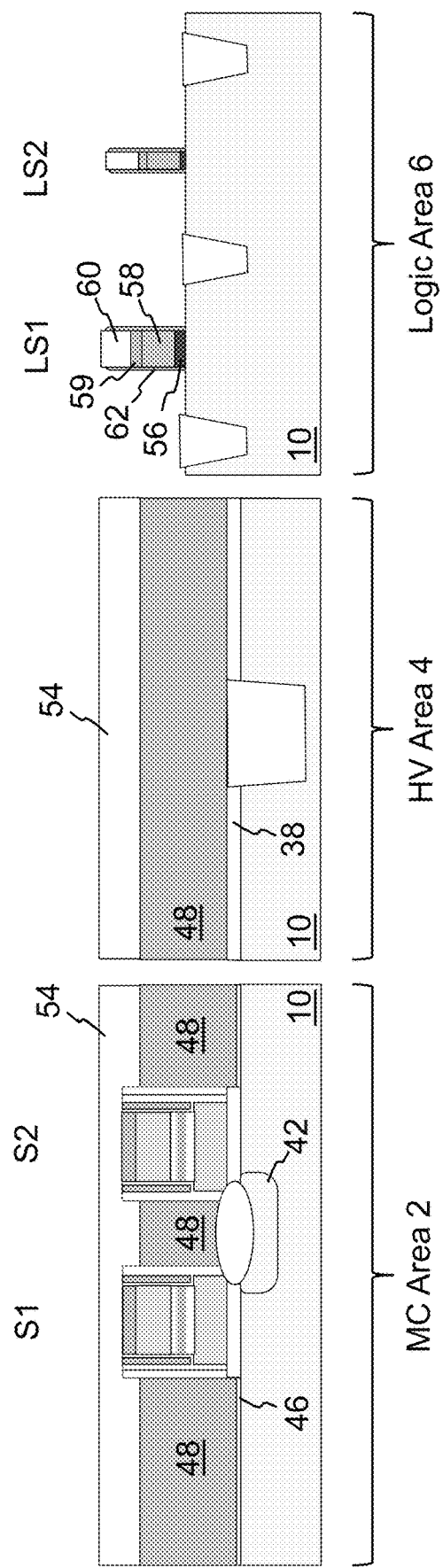

The present invention is a process of forming a semiconductor device by simultaneously forming memory cells, low voltage logic devices and high voltage logic devices on the same semiconductor substrate. The process described below involves forming memory cells in one or more memory cell areas 2 (also referred to as first or MC areas 2) of the substrate 10, high voltage logic devices in one or more high voltage logic device areas 4 (also referred to as second or HV areas 4) of the substrate 10, and low voltage logic devices in one or more low voltage logic device areas 6 (also referred to a third or logic areas 6) of the substrate 10. The process is described with respect to forming a pair of memory cells in a MC area 2, a high voltage logic device in an HV area 4, and a lower voltage logic device in a logic area 6, simultaneously. However, multiple such devices in each area may be simultaneously formed. Substrate 10 is a substrate of semiconductor material (e.g., silicon).

Referring to FIGS. 1A-16A for the MC area 2, FIGS. 1B-16B for the HV area 4, and FIGS. 1C-16C for the logic area 6, there are shown cross-sectional views of the steps in the process to make a semiconductor device. The process begins by recessing the upper surface 10a of the silicon substrate 10 in the MC area 2 and HV area 4 by a recess amount R relative to the logic area 6. Recessing the substrate upper surface 10a may be performed by forming a silicon dioxide (also referred to herein as "oxide") layer on the substrate upper surface 10a and a silicon nitride (also referred to herein as "nitride") layer on the oxide layer. A photolithography masking step is performed to cover the logic area 6 but not the MC and HV areas 2/4 with photoresist (i.e., form photoresist over all three areas, selectively expose portion(s) of the photoresist, and selectively remove portion(s) of the photoresist, leaving exposed portion(s) of the underlying structure (in this case the nitride layer in the MC and HV areas 2/4), while leaving other portion(s) of the underlying structure covered by the photoresist (in this case the nitride layer in the logic area 6). Nitride and oxide etches are performed to remove these layers from the MC and HV areas 2/4, leaving the upper surface 10a in these areas exposed. After photoresist removal, a thermal oxidation is then performed to form an oxide layer on the exposed portions of the upper surface 10a in the MC and HV areas 2/4, while not affecting the upper surface 10a in the logic area 6 (protected by the nitride and oxide layers. This thermal oxidation process consumes some of the silicon of the substrate 10 in MC and HV areas 2/4, effectively lowering the upper surface 10a in these areas by recess amount R. Nitride and oxide etches are then used to remove all the oxide and nitride layers, resulting in the structure shown in FIGS. 1A, 1B and 1C. The upper surface 10a in the MC and HV areas 2/4 is recessed by recess amount R (e.g., ~300 Å) relative to the upper surface 10a in the logic area 6.

Next, an oxide layer 12 is formed on the upper surface 10a (e.g., by deposition or by thermal growth, etc.). Thereafter, a conductive layer 14 (i.e. a first conductive layer), such as a polysilicon layer, is formed on oxide layer 12. Conductive layer 14 could instead be amorphous silicon, either in-situ doped or undoped. An implantation and anneal is performed if polysilicon or amorphous silicon is used for conductive layer 14. Oxide layer 18 is formed on conductive layer 14, followed by a nitride layer 20 formed on oxide layer 18. A photolithography masking step is then performed to cover the MC and HV areas 2/4 with photoresist 21, but leaving the logic area 6 exposed (i.e., the photoresist 21 is removed from the logic area 6 as part of the masking step). A nitride etch is then used to thin (i.e., reduce the thickness of) nitride layer 20 in the logic area 6 (e.g., preferably the time of the etch is set so that the etch thins nitride layer 20 in the logic area 6 by an amount approximately equal to recess amount R, so that the top surfaces of nitride layer 20 in all three areas 2/4/6 are substantially even), as shown in FIGS. 2A, 2B and 2C.

After photoresist 21 is removed, a photolithography masking step is used to selectively cover portions of each area with photoresist. Nitride, oxide, polysilicon and/or silicon etches are used to form trenches through nitride layer 20, oxide layer 18, conductive layer 14, oxide layer 12 and into silicon substrate 10. The trenches are then filled with oxide 22 by oxide deposition and chemical mechanical polish (CMP) stopping on nitride layer 20, as shown in FIGS. 3A and 3B. The trenches filled with oxide 22 extend parallel to the active regions in the MC area 2, and because FIG. 3A is a cross sectional view of one of the active regions, the trenches filled with oxide 22 are not shown in FIG. 3A. Oxide 22 is an insulation material that can also be referred to as STI (shallow trench isolation) oxide 22. STI oxide 22 can include a liner oxide formed by thermal oxidation before the oxide deposition.

A series of implants can be performed to create the desired wells in the substrate 10 in each of the areas 2/4/6 (with photoresist protecting one or more of the other areas during each implantation), followed by an oxide etch back to recess the STI oxide 22 below the top of nitride layer 20. A nitride etch is then used to remove nitride layer 20. An insulation layer 24 is then formed over the structure. Preferably, the insulation layer 24 is an ONO composite layer with oxide/nitride/oxide sublayers (formed by oxide, nitride, oxide depositions and anneal). However, insulation layer 24 could instead be formed of a composite of other dielectric layers, or a single dielectric material with no sublayers. A conductive layer 26 (i.e., a second conductive layer), such as a polysilicon layer, is then formed on the structure, in one example by deposition. Conductive layer 26 could instead be amorphous silicon, either in-situ doped or undoped. An implantation and anneal is performed if polysilicon or undoped amorphous silicon is used for conductive layer 26. A hard mask layer 28 is then formed on conductive layer 26. Hard mask layer 28 can be nitride, SiCN, or a composite of oxide, nitride and/or SiCN layers. The resulting structure is shown in FIGS. 4A, 4B and 4C.

A photolithography masking step is used to form photoresist 30 on the structure, where it is removed from the HV and logic areas 4/6 and selectively removed from the MC area 2, to expose hard mask layer 28 in the HV and logic areas 4/6 and expose only portions of hard mask layer 28 in the MC area 2. A series of etches are used to remove exposed portions of hard mask layer 28, conductive layer 26 and insulation layer 24, leaving pairs of spaced apart stack structures S1 and S2 of hard mask layer 28, conductive layer 26 and insulation layer 24 in the MC area 2, and entirely removing these layers from the HV and logic areas 4/6. The resulting structure is shown in FIGS. 5A, 5B and 5C.

After photoresist 30 is removed, an oxide deposition or thermal oxidation and etch are used to form oxide spacers 32 along the sides of stacks S1 and S2 in the MC area 2. A nitride deposition and etch are used to form nitride spacers 34 along the sides of oxide spacers 32. The oxide and nitride etches could be combined. An etch, such as a polysilicon or silicon etch, depending on the material of conductive layer 14, is performed to remove the exposed portions of conductive layer 14, with the result that each spaced apart stack structure S1/S2 includes a block of conductive material 14a from the remains of conductive layer 14 in the MC area 2, and conductive layer 14 is entirely removed from the HV/logic areas 4/6. Oxide spacers 36 are formed on the sides of the stack structures S1/S2 including along the exposed ends of the block of conductive material 14a by oxide deposition and oxide anisotropic etch, as shown in FIGS. 6A, 6B and 6C.

A photolithographic masking step is used to cover MC and logic areas 2/6 with photoresist, but leave exposed HV area 4. An oxide etch is used to remove oxide layer 12 from the fly area 4. After photoresist removal, insulation layer 38 is then formed on the substrate upper surface 10a in the HV area 4 by thermal growth and/or deposition, as well as on the structures in the MC area 2 and on top of insulation layer 38 in logic area 6. Insulation layer 38 can be oxide and/or oxynitride, and will serve as the gate oxide for the HV devices. However, it should be noted that the removal and replacement of oxide layer 12 with insulation layer 38 is optional, and oxide layer 12 could instead be used as part of, or the entirety of, the gate oxide for the HV devices. After photoresist removal, photoresist 40 is formed on the structure and only removed from the area between the stacks S1 and S2 (referred to herein as the inner stack area) in the MC area 2. An implantation process is performed to form (first) source region 42 in the substrate between the stacks S1 and S2. An oxide etch is then used to remove insulation layer 38, oxide spacers 36 and the oxide layer 12 in the inner stack areas. The resulting structure is shown in FIGS. 7A, 7B and 7C.

After photoresist 40 is removed, a tunnel oxide 44 is formed on the structure. The tunnel oxide 44 could be oxide and/or oxidenitride formed by deposition and/or thermal growth. Because of catalytic effects of the higher dopant levels in the source region 42, tunnel oxide 44 can have a thicker portion 44a on the source region 42. A photolithographic masking step is used to cover the HV and logic areas 4/6, and the inner stack area in the MC area 2, with photoresist. The areas on the other sides of stack structures S1 and S2 from the inner stack area (referred to herein as the outer stack areas) are left exposed. An implant can be performed at this time for the portions of substrate 10 in the outer stack areas (i.e., those substrate portions that will be under the select gates to be formed later). An oxide etch is used to remove exposed portions of oxide layer 12 in the outer stack areas. After photoresist removal, insulation layer 46 is then formed on the structure. Insulation layer 46 can be oxide and/or oxynitride or any other appropriate dielectric material, formed by deposition and/or thermal growth. The formation of insulation layer 46 thickens or becomes part of tunnel oxide 44 and insulation layer 38. The resulting structure is shown in FIGS. 8A, 8B and 8C.

A conductive layer 48 (i.e., a third conductive layer), such as a polysilicon layer, is formed on the structure. Conductive layer 48 can be in-situ doped or undoped, and could instead be amorphous silicon. Doping and anneal would then be performed if undoped polysilicon or amorphous silicon is used for conductive layer 48. A chemical mechanical polish (CMP) is performed to planarize the top surface of the structure. A further etch back process is used to recess the upper surface of conductive layer 48 below the tops of stacks S1 and S2, as shown in FIGS. 9A, 9B and 9C.

At this stage, the majority of the memory cell formation is completed. A protective insulation layer 54 is formed over the structure. Protective insulation layer 54 can be oxide, nitride, SiCN or combinations thereof. A photolithographic masking step is used to cover the MC and HV areas 2/4 with photoresist, while leaving the logic area 6 exposed. One or more etches are used to remove protective layer 54, conductive layer 48, insulation layer 38 and oxide layer 12 in the logic area 6, as shown in FIGS. 10A, 10B and 10C (after photoresist removal). The protective layer 54 protects the MC and HV areas 2/4 from this series of etches.

Implantations can be performed at this time to form doped P and N wells in the substrate 10 in the logic area 6. A dielectric layer 56 is formed on the exposed substrate upper surface 10a in the logic area 6 (which can serve as the gate dielectric for the logic devices). Dielectric layer 56 can be silicon oxide, silicon oxynitride, a high-K dielectric layer, or a composite thereof. A high K insulation material is insulation material having a dielectric constant K greater than that of silicon dioxide. Examples of high K insulation materials include $HfO_2$, $ZrO_2$, $TiO_2$, $Ta_2O_5$, and combinations thereof. A dummy conductive layer 58, such as a polysilicon layer, is then formed over the structure. An insulation layer 59 (also referred to herein as a logic insulation layer 59) such as a nitride, and a hard mask layer 60, are then formed on dummy conductive layer 58. A photolithography masking step is used to cover select portions of the logic area 6 with photoresist, leaving insulation layer 59 and hard mask layer 60 in the entire MC and HV areas 2/4, as well as part of the logic area 6, exposed. An etch is then used to remove the exposed areas of the insulation layer 59 and hard mask layer 60 in the MC, HV, and logic areas 2/4/6. After photoresist removal, etches are used to remove the exposed portions of dummy conductive layer 58 and dielectric layer 56 (i.e., all portions not protected by the remaining portions of hard mask layer 60 in the logic area 6), leaving logic stack structures LS1 and LS2 in the logic area 6, which include blocks of dummy conductive material 58 disposed on dielectric layer 56. Dielectric spacers 62 (e.g., nitride) are formed on the sides of logic stack structures LS1/LS2 by deposition and etch. Implantations into the substrate 10 in the logic area 6 can be performed at this time. The resulting structure is shown in FIGS. 11A, 11B and 11C.

A photolithography masking step is used cover the logic area 6, portions of HV area 4, and portions of the MC area 2, with photoresist 64 (i.e., cover the inner stack area, stack structures S1 and S2, and those portions of the outer stack areas immediately adjacent stack structures S1 and S2). Etches are used to remove exposed portions of protective layer 54 and conductive layer 48, as shown in FIGS. 12A, 12B and 12C. After photoresist 64 is removed, additional selective implantations and etches can be performed in the different exposed portions of substrate 10 (i.e., by additional photolithography mask steps and implantations). For example, the logic area 6 can be covered by photoresist leaving MC and HV areas 2/4 exposed, and the portions of substrate 10 only covered by insulation layers 38 and 46 are subjected to implantation. A photolithography masking step is used cover the logic area 6, leaving MC and HV areas 2/4 exposed. An etch is then used to thin exposed portions of insulation layers 38 and 46 (which also thins protective insulation layer 54), which can provide better implant penetration in the HV area 4 later in the process. The resulting structure is shown in FIGS. 13A, 13B and 13C (after photoresist removal).

Figures 14A, 14B, 14C:
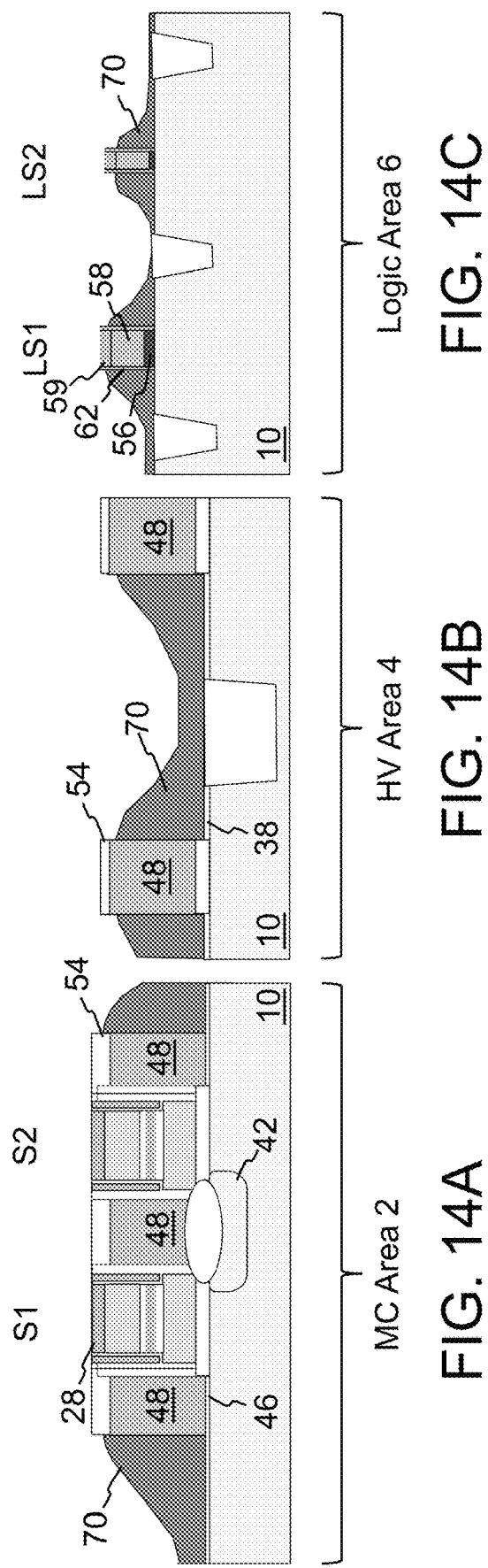

A semi-nonconformal layer 70 is formed on the structure. This layer carries some of the conformality of the underlying topography, but is thinner at the tops of the underlying topography compared to where vertical and horizontal surfaces meet. To achieve such a varying thickness, a flowable material is preferably used to form layer 70. One non-limiting exemplary material for semi-nonconformal layer 70 is a BARC material (bottom anti-reflectant coating), which is commonly used to reduce reflectivity at resist interfaces during photolithography. BARC materials are flowable and wettable, and are easily etched and removed with minimal process damage due their high selectivity relative to oxide. Other materials that can be used for semi-nonconformal layer 70 include photoresist or spin-on-glass (SOG). An etch (e.g., anisotropic) is used to remove the upper portion of semi-nonconformal layer 70 from, and to expose, protective insulation layer 54 on the stack structures S1/S2 and on the remaining portions of conductive layer 48, and hard mask layer 60 on logic stack structures LS1/LS2, while keeping semi-nonconformal layer 70 covering insulation layers 38 and 46 (i.e., this portion of semi-nonconformal layer 70 acts as a hard mask for the next etch step). An etch is used to remove hard mask layer 60 on the logic stack structures LS1/LS2. The resulting structure is shown in FIGS. 14A, 14B and 14C.

After removal of semi-nonconformal layer 70, oxide and nitride depositions, followed by a spacer etch, are used to form oxide spacers 66 and nitride spacers (not shown) on the sides of stack structures S1/S2 in the MC area 2, on the sides of stack structures LS1/LS2 in the logic area 6, and on the sides of the structures in the HV area 4. Implantations are performed to form (first) drain regions 74 in the substrate adjacent the oxide spacers 66 in the MC area 2, (second) source and (second) drain regions 76/78 adjacent the oxide spacers 66 in the HV area 4, and (third) source and (third) drain regions 80/82 adjacent the oxide spacers 66 in the logic area 6. Implantations for any given region can be performed by forming photoresist to block the implantation for other region(s) not to be implanted. For example, drain regions 74 in the MC area 2, source/drain regions 76/78 in the HV area 4, and source/drain regions 80/82 in the logic area 6, of the same doping type, can be formed simultaneously by forming photoresist on area of the opposite source/drain doping type, and then performing a single implantation in the MC, HV, and logic areas 2/4/6. A blocking layer 84 can be formed at this time by deposition, masking step and etch, for blocking any silicidation in the next step. Any remaining portions of protective insulation layer 54 in the MC and HV areas 2/4, which are not protected by blocking layer 84, are also removed during above etch, exposing conductive layer 48 to subsequent silicidation. Metal deposition and anneal is then performed to form silicide 86 on the top surfaces of exposed portions of conductive layer 48, source regions 76/80 and drain regions 74/78/82. Blocking layer 84 prevents silicide formation for any portions for which such formation is not desired. Optionally, blocking layer 84 can be maintained in select portions of the source/drain areas 74/76/78/80/82 and/or portions of conductive layer 48, to block silicide formation in these select regions. An etch, such as a nitride etch, is then used to remove the nitride spacers on oxide spacers 66 and insulation layer 59 in the logic area 6 (exposing the blocks of dummy conductive layer 58) and hard mask layer 28 in the MC area 2. The resulting structure is shown in FIGS. 15A, 15B and 15C.

A layer 88 (e.g., nitride) is formed over the structure. A thick layer of inter-layer dielectric (ILD) insulation material 90 is then formed on layer 88. CMP is performed to planarize and recess the thick layer of ILD insulation material 90 to expose dummy conductive layer 58 in the logic area 6. A photolithography masking step is used to cover the MC and HV areas 2/4 with photoresist, while leaving the logic area 6 exposed. An etch, such as a polysilicon etch, is then used to remove the blocks of dummy conductive layer 58 in the logic area 6. A layer of metal material such as Al, Ti, TiAlN, TaSiN, TaN, TiN, or other appropriate metal material, without limitation, or a composite thereof, is formed over the structure. A CMP is then performed to remove the metal gate material layer, leaving blocks of metal material 94 disposed on dielectric layer 56 in the logic area 6. The final structure is shown in FIGS. 16A, 16B and 16C.

Figure 17:
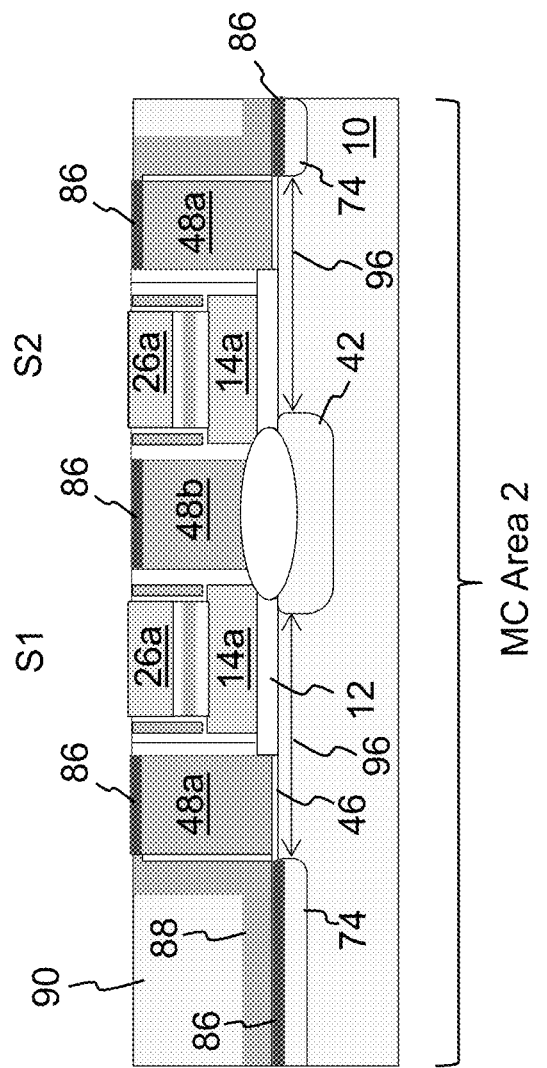
FIG. 17 is a cross sectional view of the memory cell area showing the finished memory cells.

FIG. 17 shows the final memory cell structure in the MC area 2, which includes pairs of memory cells each sharing a source region 42 spaced apart from two drain regions 74, with channel regions 96 in the silicon 10 extending there between. Each memory cell includes a floating gate 14a (i.e., a block of conductive material remaining from conductive layer 14) disposed over and insulated from a first portion of the channel region 96 for controlling the conductivity thereof, a select gate 48a (i.e., which can also be referred to a word line gate, and is a block conductive material remaining from conductive layer 48) disposed over and insulated from a second portion of the channel region 96 for controlling the conductivity thereof, a control gate 26a (i.e., a block of conductive material remaining from conductive layer 26) disposed over and insulated from the floating gate 14a, and an erase gate 48b (i.e., a block of conductive material remaining from conductive layer 48) disposed over and insulated from the source region 42 (shared by the pair of memory cells). The pairs of memory cells extend in the column direction (BL direction), and columns of the memory cells are formed, with STI oxide 22 between adjacent columns. A row of the control gates are formed as a continuous control gate line that connects the control gates 26a together for an entire row of the memory cells. A row of the select gates 48a are formed as a continuous select gate line (also known as a word gate line) that connects the select gates 48a together for an entire row of the memory cells. A row of the erase gates 48b are formed as a continuous erase gate line that connects the erase gates together for an entire row of pairs of the memory cells.

Figure 18:
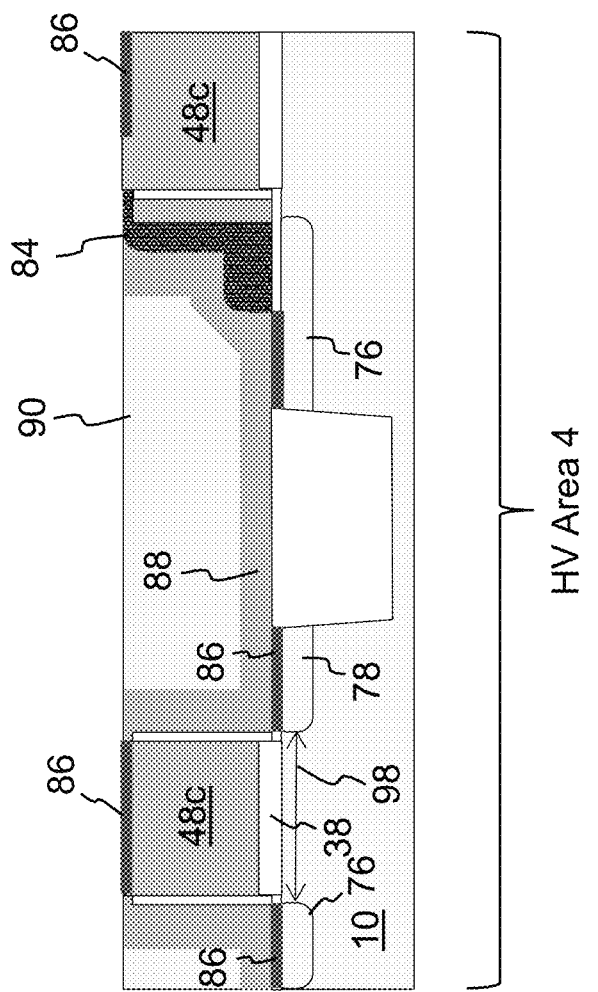
FIG. 18 is a cross sectional view of the HV area showing the finished HV devices.

The final HV devices are shown in FIG. 18. Each HV device includes spaced apart source and drain regions 76 and 78 with a channel region 98 of the silicon substrate 10 extending there between. An HV gate 48c (i.e., a block of conductive material remaining from conductive layer 48) is disposed over and insulated from the channel region 98 for controlling the conductivity thereof.

Figure 19:
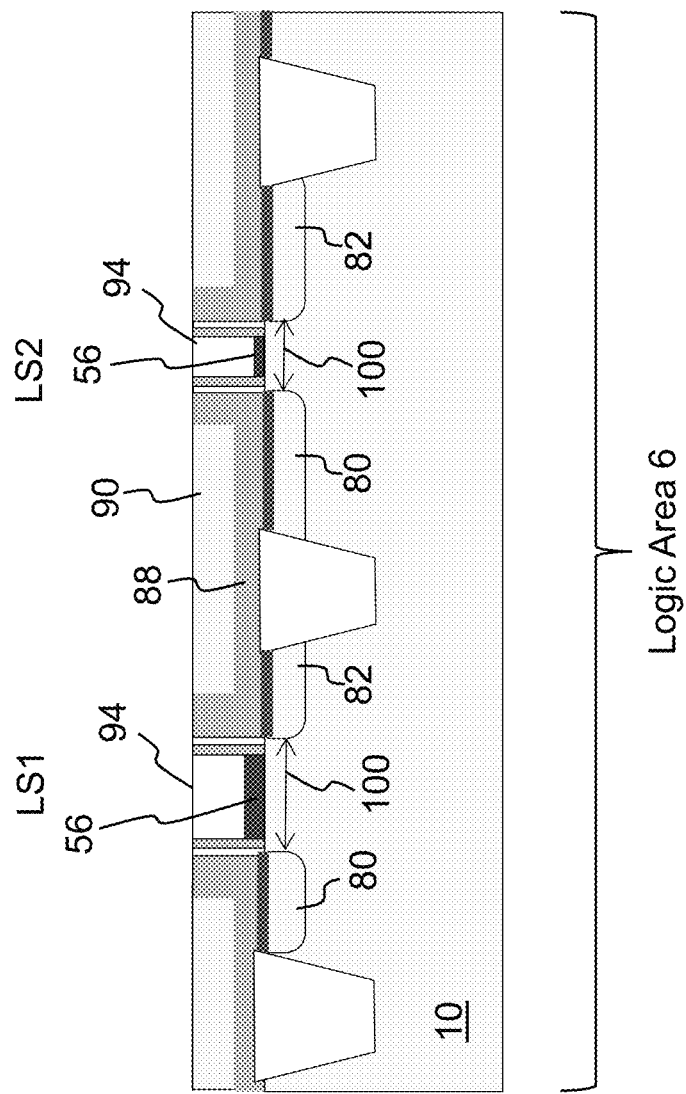
FIG. 19 is a cross sectional view of the logic area showing the finished logic devices.

The final logic devices are shown in FIG. 19. Each logic device includes spaced apart source and drain regions 80 and 82 with a channel region 100 of the silicon substrate 10 extending there between. Blocks of metal material 94 are metal gates 94 disposed over and insulated from the channel region 100 (by dielectric layer 56) for controlling the conductivity thereof.

There are a number of advantages of the above described method of forming memory cells, HV devices and logic devices on the same substrate. The memory cells and HV devices formation is completed before the metal gates 94 are formed in the logic area 6, so that the metal gates 94 in the logic area 6 will not be adversely affected by the formation of the memory cells and HV devices. The process steps for the formation of the gates in the MC and HV areas 2/4 are separate and independent from (and can be customized relative to) the process steps for the formation of the gates in the logic area 6. The MC and HV areas 2/4 are covered by protective insulation layer 54 after most of the memory cell and HV device formation is completed and before the processing in the logic area 6 (i.e., before the removing of the layers in the logic area 6 left from the memory cell and HV device formation, and before the depositing and removing of the layers used for forming the logic devices including dummy polysilicon removal, without limitation). The upper surface 10a of the substrate 10 is recessed in the MC and HV areas 2/4 relative to that in the logic area 6 to accommodate the taller structurers in the MC/HV areas 2/4 (i.e., so that tops of the shorter logic devices in the logic area 6 are approximately even with the tops of the taller memory cells and HV devices in the MC/HV areas 2/4, and so that CMP across all three areas can be used for processing— e.g., the tops of the select gates 48a and HV gates 48c are substantially even with dummy conductive layer 58 during the CMP of ILD 90). Layer 88 protects the silicided conductive layer 48 from the CMP used in forming the metal gates 94, and the conductive layer 26 assists as a stop layer for this CMP. Silicide 86 enhances the conductivity of the drain regions 74, and source/drain regions 76/78, source/drain regions 80/82, select gates 48a, erase gates 48b and HV gates 48c. The semi-nonconformal layer 70 protects the oxide and silicon in the source/drain regions of the MC and HV areas 2 while hard mask layer 60 is being removed from the logic area 6. The memory cell select gates 48a, memory cell erase gates 48b and HV gates 48c, are formed using a single conductive material deposition (i.e., a single polysilicon layer formed by a single polysilicon deposition can be used to form all three types of gates). Moreover, the same polysilicon etch can be used define one of the edges of each select gate 48a and both edges of each HV gate 48c. The thicknesses of the various layers 46, 12, 38 and 56 (which are used as gate oxides) are independent of each other with each optimized for its respective gate operation. For example, insulation layer 46 under the select gates 48a is preferably thinner than oxide layer 12 under the floating gates 14a.

The nitride etch to thin nitride layer 20 (see FIGS. 2A-2C and related description) provides for the top surface of the nitride layer 20 to be substantially even in the MC, HV and logic areas 2/4/6 for better and more uniform subsequent processing across all three areas, even though the MC and HV areas 2/4 have a recessed substrate upper surface 10a relative to the logic area 6 (and oxide layers 12/18 and conductive layer 14 under nitride layer 20 are formed in all three areas). The CMP used to planarize conductive layer 48 with the tops of the stack structures S1 and S2, followed by an etch to recess the conductive layer 48 below the tops of the stack structures S1 and S2 (see FIGS. 9A-9C and related descriptions), provides reliable control of the height of conductive layer 48 in the MC and HV areas 2/4 (e.g., using APC (auto process control) to measure the conductive layer 48 thickness before etch process, and then derive the etch time based on etch rate of the etch), thus avoiding an additional masking step. Finally, the protective insulation layer 54 in the MC and HV areas 2/4, and the hard mask layer 60 in the logic area 6, are etched after the formation of the semi-conformal layer 70 is formed, thus avoiding the need for an extra masking step before forming silicide 86.

FIGS. 20A-25A, 20B-25B and 20C-25C disclose an alternate embodiment, starting with the structure shown in FIGS.

1A-1C. An oxide layer 101 is formed on the upper surface 10a by oxide deposition or thermal oxidation. Then, a nitride layer 102 is formed on the oxide layer 101. A photolithography masking step is then performed to cover the MC and HV areas 2/4 with photoresist 104, but leaving the logic area 6 exposed. A nitride etch is then used to thin (i.e., reduce the thickness of) nitride layer 102 in the logic area 6, making the top surfaces of nitride layer 102 substantially even in all three areas, i.e. MC, HV and logic areas 2/4/6, as shown in FIGS. 20A, 20B and 20C.

After photoresist 104 is removed, a photolithography masking step is used to selectively cover portions of each area with photoresist. Nitride, oxide and silicon etches are used to form trenches through nitride layer 102, oxide layer 101 and into silicon substrate 10. After photoresist removal, the trenches are then filled with STI oxide 106 by oxide deposition and chemical mechanical polish (CMP) stopping on nitride layer 102, as shown in FIGS. 21A, 21B and 21C. STI oxide 106 can include a liner oxide formed by thermal oxidation before the oxide deposition.

A photolithography masking step is then performed to cover the logic area with photoresist, but leaving MC and HV areas 2/4 exposed. One or more etches are then used to remove nitride layer 102 and oxide layer 101 from the MC and HV areas 2/4. After photoresist removal, an oxide layer 108 is formed on the substrate surface 10a in the MC and HV areas 2/4, for example by thermal oxidation. A conductive layer 110, such as a polysilicon layer, is then formed on the structure by, for example, deposition. Conductive layer 110 could instead be amorphous silicon, either in-situ doped or undoped. An implantation and anneal is performed if undoped polysilicon or amorphous silicon is used for layer 110. A chemical-mechanical polish, and etch back, are used to planarize and recess conductive layer 110 in the MC and HV areas 2/4 and remove conductive layer 110 from the logic area 6. An oxide etch can then be used to recess the STI oxide 106. The resulting structure is shown in FIGS. 22A, 22B and 22C.

Figures 24A, 24B, 24C:
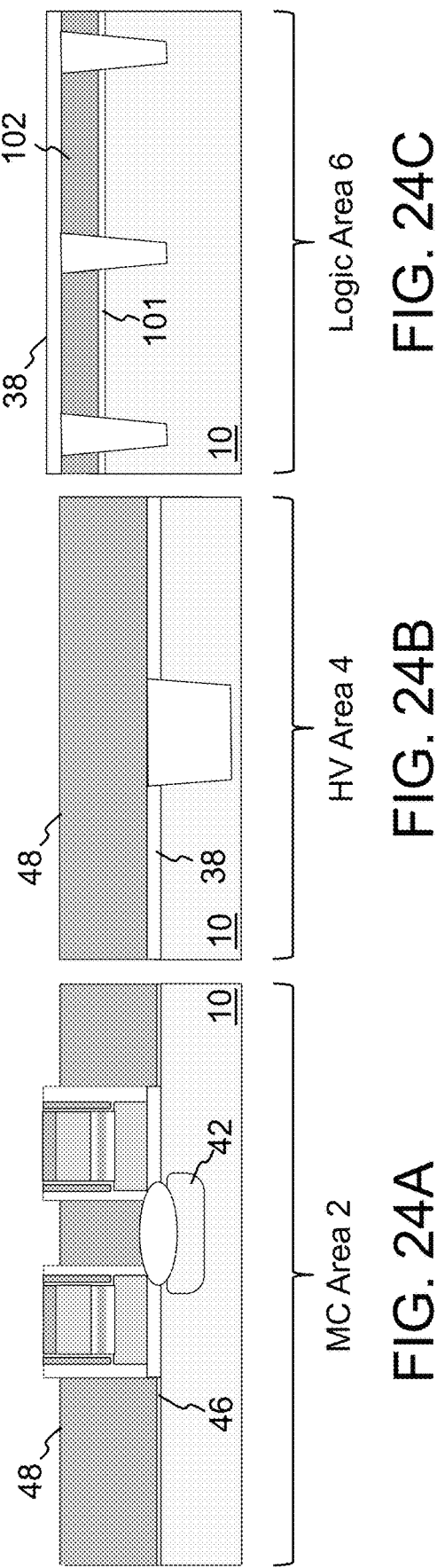

The formation of insulation layer 24, conductive layer 26, hard mask layer 28, stack structures S1 and S2, oxide spacers 32, oxide spacers 36, insulation layer 38, source regions 42, tunnel oxide 44, and insulation layer 46 is then performed using the steps described above with respect to FIGS. 4A-8A, 4B-8B and 4C-8C. The resulting structure is shown in FIGS. 23A, 23B, and 23C. The formation of conductive layer 48 as described above is then performed (i.e., deposition, CMP and etch back), which will result in the complete removal of conductive layer 48 from the logic area 6 by the CMP because of the presence of nitride layer 102 in logic area 6, as shown in FIGS. 24A-24C. Protective insulation layer 54 is then formed on the conductive layer 48 in the MC and HV areas 2/4 as described above, followed by etches to remove insulation layer 38, oxide layer 101 and nitride layer 102 from the logic area 6, and recess STI oxide 106 in the logic area 6, as shown in FIGS. 25A-25C. The processing steps described above with respect to FIGS. 11A-11C to 16A-16C are performed to complete the structure. The advantages of this alternate embodiment is that simpler, more efficient etches can be used to form the trenches to be filled with STI oxide 106 (because the trenches are formed through only two layers before reaching the substrate 10 (see FIGS. 21A-21C) as opposed to four layers before reaching the substrate 10 (see FIGS. 3A-3C).

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell area and the logic areas of the present invention, unless otherwise specified in the claims. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between). For example, forming an element "over a substrate" can include forming the element directly on the substrate with no intermediate materials/elements therebetween, as well as forming the element indirectly on the substrate with one or more intermediate materials/elements therebetween.

What is claimed is:

1. A method of forming a semiconductor device, comprising:
   providing a substrate of semiconductor material that includes a first area, a second area and a third area;
   recessing an upper surface of the substrate in the first area and an upper surface of the substrate in the second area relative to an upper surface of the substrate in the third area;
   forming a first conductive layer disposed over and insulated from the upper surfaces in the first and second and third areas;
   forming an insulation layer on the first conductive layer in the first and second and third areas;
   thinning the insulation layer in the third area without thinning the insulation layer in the first and second areas;
   forming trenches through the insulation layer and the first conductive layer, and into the substrate, in the first, second and third areas;
   filling the trenches with insulation material;
   after the filling of the trenches, removing the insulation layer from the first, second and third areas;
   forming a second conductive layer disposed over and insulated from the first conductive layer in the first and second and third areas;
   performing one or more etches to selectively remove portions of the first and second conductive layers in the first area, to entirely remove the first and second conductive layers from the second and third areas, wherein the one or more etches result in pairs of stack structures in the first area with each of the stack structures including a control gate of the second conductive layer disposed over and insulated from a floating gate of the first conductive layer;
   forming first source regions in the substrate each disposed between one of the pairs of stack structures;
   forming a third conductive layer disposed over and insulated from the upper surfaces of the substrate in the first and second and third areas;

forming a protective insulation layer over the third conductive layer in the first and second areas;
after the forming of the protective insulation layer, removing the third conductive layer from the third area;
after the removing of the third conductive layer from the third area, forming blocks of dummy conductive material disposed over and insulated from the upper surface in the third area;
after the forming of the blocks of dummy conductive material in the third area, etching portions of the protective insulation layer and portions of the third conductive layer in the first and second areas to form a plurality of select gates of the third conductive layer each disposed adjacent to one of the stack structures and to form a plurality of HV gates of the third conductive layer each disposed over and insulated from the upper surface of the substrate in the second area;
forming first drain regions in the substrate each adjacent to one of the select gates;
forming second source regions in the substrate each adjacent one of the HV gates;
forming second drain regions in the substrate each adjacent one of the HV gates;
forming third source regions in the substrate each adjacent one of the blocks of dummy conductive material;
forming third drain regions in the substrate each adjacent one of the blocks of dummy conductive material; and
replacing each of the blocks of dummy conductive material with a block of metal material.

2. The method of claim 1, wherein each of the blocks of metal material is insulated from the upper surface of the substrate in the third area by a layer of high K insulation material.

3. The method of claim 1, wherein before the replacing, each of the blocks of dummy conductive material is insulated from the upper surface of the substrate in the third area by a layer of high K insulation material, and wherein the replacing further comprises forming each of the blocks of metal material on the layer of high K insulation material.

4. The method of claim 1, wherein for each of the pairs of stack structures, an erase gate of the third conductive layer is disposed between the pair of stack structures, and over and insulated from one of the source regions.

5. The method of claim 1, wherein each of the first, second and third conductive layers is formed of polysilicon or amorphous silicon.

6. The method of claim 1, further comprising:
forming silicide on the first, second and third drain regions and on the second and third source regions.

7. The method of claim 4, further comprising:
before the replacing, forming silicide on the select gates, the erase gates and the HV gates.

8. The method of claim 1, wherein for each of the stack structures, the control gate is insulated from the floating gate by an ONO insulation layer.

9. The method of claim 4, wherein the forming of the blocks of dummy conductive material includes forming a logic insulation layer on the blocks of dummy conductive material and a hard mask layer on the logic insulation layer.

10. The method of claim 9, wherein before the replacing, further comprising:
forming a layer of flowable material in the first, second and third areas;
removing a portion of the layer of flowable material to expose the hard mask layer;
removing the hard mask layer; and
removing the layer of flowable material.

11. The method of claim 10, further comprising:
forming silicide on the select gates, the erase gates and the HV gates, wherein the logic insulation layer prevents the formation of silicide on the blocks of dummy conductive material.

12. A method of forming a semiconductor device, comprising:
providing a substrate of semiconductor material that includes a first area, a second area and a third area;
recessing an upper surface of the substrate in the first area and an upper surface of the substrate in the second area relative to an upper surface of the substrate in the third area;
forming an insulation layer over the substrate;
thinning the insulation layer in the third area without thinning the insulation layer in the first and second areas;
forming trenches through the insulation layer and into the substrate, in the first, second and third areas;
filling the trenches with insulation material;
after the filling of the trenches, removing the insulation layer from the first and second areas;
forming a first conductive layer disposed over and insulated from the upper surfaces in the first and second;
forming a second conductive layer disposed over and insulated from the first conductive layer in the first and second areas;
performing one or more etches to selectively remove portions of the first and second conductive layers in the first area, and to entirely remove the first and second conductive layers from the second area, wherein the one or more etches result in pairs of stack structures in the first area with each of the stack structures including a control gate of the second conductive layer disposed over and insulated from a floating gate of the first conductive layer;
forming first source regions in the substrate each disposed between one of the pairs of stack structures;
forming a third conductive layer disposed over and insulated from the upper surfaces of the substrate in the first and second areas;
forming a protective insulation layer over the third conductive layer in the first and second areas;
after the forming of the protective insulation layer, removing the protective insulation layer from the third area;
after the removing of the protective insulation layer from the third area, forming blocks of dummy conductive material disposed over and insulated from the upper surface in the third area;
after the forming of the blocks of dummy conductive material in the third area, etching portions of the protective insulation layer and portions of the third conductive layer in the first and second areas to form a plurality of select gates of the third conductive layer each disposed adjacent to one of the stack structures and to form a plurality of HV gates of the third conductive layer each disposed over and insulated from the upper surface in the second area;
forming first drain regions in the substrate each adjacent to one of the select gates;
forming second source regions in the substrate each adjacent one of the HV gates;
forming second drain regions in the substrate each adjacent one of the HV gates;
forming third source regions in the substrate each adjacent one of the blocks of dummy conductive material;

forming third drain regions in the substrate each adjacent one of the blocks of dummy conductive material; and replacing each of the blocks of dummy conductive material with a block of metal material.

13. The method of claim 12, wherein each of the blocks of metal material is insulated from the upper surface in the third area by a layer of high K insulation material.

14. The method of claim 12, wherein for each of the pairs of stack structures, an erase gate of the third conductive layer is disposed between the pair of stack structures, and over and insulated from one of the source regions.

15. The method of claim 14, further comprising:
forming silicide on the first, second and third drain regions, the second and third source regions, the select gates, the erase gates and the HV gates.

16. The method of claim 12, wherein for each of the stack structures, the control gate is insulated from the floating gate by an ONO insulation layer.

* * * * *